United States Patent [19]

Shibata et al.

[11] Patent Number: 5,762,744
[45] Date of Patent: Jun. 9, 1998

[54] METHOD OF PRODUCING A SEMICONDUCTOR DEVICE USING AN EXPAND TAPE

[75] Inventors: Kazutaka Shibata; Yutaka Murakami, both of Kyoto, Japan

[73] Assignee: Rohm Co., Ltd., Kyoto, Japan

[21] Appl. No.: 870,643

[22] Filed: Jun. 6, 1997

Related U.S. Application Data

[60] Continuation of Ser. No. 200,290, Feb. 22, 1994, abandoned, which is a division of Ser. No. 816,398, Dec. 27, 1991, Pat. No. 5,316,853.

[51] Int. Cl.[6] .............. B32B 31/12; B32B 31/18; H01L 21/00
[52] U.S. Cl. .............. 156/235; 156/344; 156/584; 437/266
[58] Field of Search .............. 156/235, 344, 156/584; 437/266

[56] References Cited

U.S. PATENT DOCUMENTS

| 4,720,317 | 1/1988 | Kuroda et al. | 156/250 |
| 4,961,804 | 10/1990 | Aurichio | 156/248 |
| 5,030,308 | 7/1991 | Sheyon et al. | 156/235 |
| 5,110,388 | 5/1992 | Komiyama et al. | 156/229 |
| 5,275,958 | 1/1994 | Ishikawa | 437/226 |
| 5,476,565 | 12/1995 | Akada et al. | 156/235 |

FOREIGN PATENT DOCUMENTS

| 0107563 | 8/1981 | Japan. |
| 54-188940 | 10/1984 | Japan. |
| 3-152942 | 6/1991 | Japan. |
| 403286 | 12/1991 | Japan. |

*Primary Examiner*—David A. Simmons
*Assistant Examiner*—Linda L. Gray
*Attorney, Agent, or Firm*—Baker & Botts, L.L.P.

[57] ABSTRACT

A method of producing a semiconductor device wherein a metal preform layer is applied to an expand tape followed by a step of adhering a wafer to the metal preform layer using an adhesive layer of a thin adhesive sheet on the preform layer. The metal preform layer and the wafer are cut into chips wherein each chip has adhered to the bottom a cut piece of the metal preform layer. The expand tape is then expanded to separate adjacent chips from each other, and each chip is then removed from the expanded expand tape and then die-bonded to a lead frame.

1 Claim, 2 Drawing Sheets

METHOD OF PRODUCING A SEMICONDUCTOR DEVICE USING AN EXPAND TAPE

This application is a continuation of application Ser. No. 08/200,290, filed on Feb. 22, 1994, now abandoned, which is a division of application Ser. No. 07/816,398, filed Dec. 27, 1991 now U.S. Pat. No. 5,316,853.

BACKGROUND OF THE INVENTION

The present invention relates to expand tapes for use at dicing of semiconductor wafers.

A semiconductor device is generally manufactured through a cutting process of cutting a semiconductor crystal into semiconductor wafers, a dicing process of dicing the semiconductor wafer into semiconductor chips, a die-bonding process of die-bonding the semiconductor chip to a package and so on.

When the semiconductor wafer is diced, an expand tape has conventionally been used. The expand tape is made of a synthetic resin film which is expandable. At the dicing process, a wafer 14 is stuck onto a surface 11a of the expand tape as shown in FIG. 3(a). Under this state, the wafer 14 is diced (see FIG. 3(b)). When the expand tape 1 is expanded, the wafer 14 is separated into chips 15, 15, . . . , 15 (see FIG. 3(c)). These chips 15 are then die-bonded onto lead frames, etc., using a preform material (e.g., a silver or solder paste) in the subsequent die-bonding process.

A dicing process using the aforesaid conventional expand tape is separated from a die-bonding process. Thus, semiconductor device manufacturing processes involve a greater number of steps and require more hands. Further, there is another problem that the handling of the preform material in addition to the expand tape is required.

SUMMARY OF THE INVENTION

The invention has been made in view of the above circumstances. Accordingly, an object of the present invention is to provide an expand tape with which the number of semiconductor manufacturing steps as well as burden on material handling can be reduced.

To achieve the above object, the expand tape of the present invention comprises a preform layer on an expandable film.

A wafer is diced into chips after being stuck onto the expand tape. Thereafter, when the chips are picked up from the expand tape, the preform material remains adhered onto the bottom of each chip. Therefore, the chip is ready to be die-bonded onto a lead frame, etc., immediately, thereby contributing to simplifying the steps and to decreasing hands. Further, the integration of the preform material with the expand tape allows material handling problem to be reduced.

DETAILED DESCRIPTION OF THE INVENTION

An embodiment of the invention will hereunder be described with reference to FIGS. 1 and 2.

Figure 1:
FIG. 1 is a sectional view showing the main portion of an expand tape, which is an embodiment of the invention.

FIG. 1 shows a section of an expand tape 1, which is the embodiment of the invention. This expand tape 1 is formed of an expandable synthetic resin film 2, and a preform layer 3 provided thereon. The shape of the expand tape may be circular. The preform layer 3 is formed by applying a conductive paste made of epoxy containing Ag or polyimide containing Ag, a solder paste made of Sn—Pb, or a tape material made of Au—Si or Au—Ge to the synthetic resin film 2.

FIGS. 2(a) to 2(d) are diagrams sequentially showing a dicing process using the expand tape 1. First, a wafer 4 is adhered to the preform layer 3 of the expand tape 1 (see FIG. 2(a)). The adhesion is carried out using thermal effects or an adhesive layer of a thin adhesive sheet 8 fixed to layer 3 by a roller or coating. Then, the wafer 4 is cut into chips 5, . . . , 5 using a dicing saw such as a thin circular diamond blade (not shown). The cutting is carried out by, for example, moving the dicing saw along the surface of the expand tape 1 from a portion on which the wafer is not adhered, through the wafer, to the other portion on which the wafer is not adhered. The depth of dicing grooves 6, . . . , 6 reaches the film 2 so that the preform layer 3 can also be cut (see FIG. 2(b)).

Figure 2A:
FIGS. 2(a) to 2(d) are diagrams illustrative of a dicing process using the expand tape of the invention in sequence.
Figure 2B:
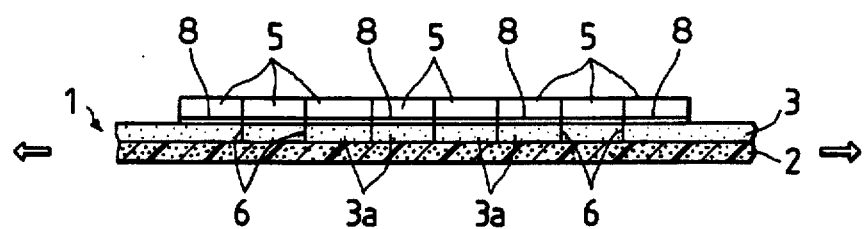
Figure 2C:
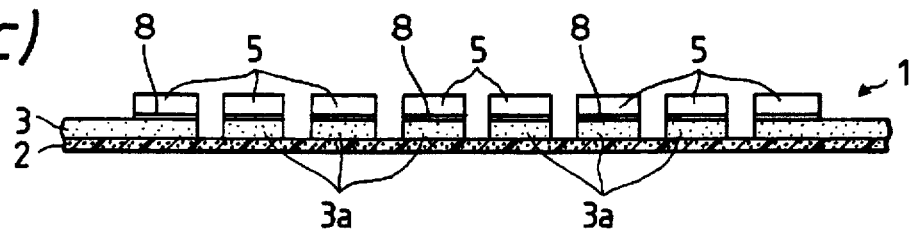

When tensile force is applied, for example, concentrically to the expand tape 1 to expand it under this state, the chips 5, . . . , 5 are separated (see FIG. 2(c)). At the same time, the preform layer 3 are also separated into pieces 3a, . . . , 3a together with the chips 5, . . . , 5.

Figure 2D:
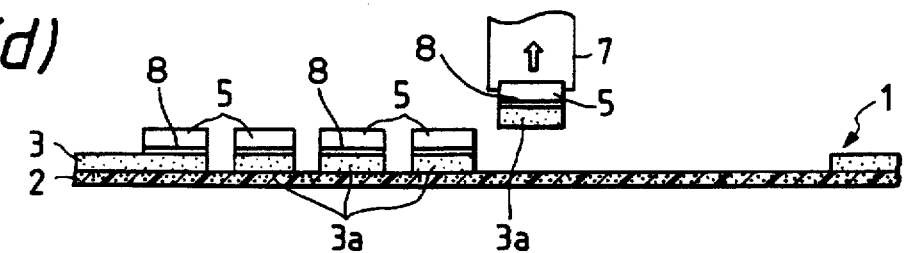
Figure 3A:
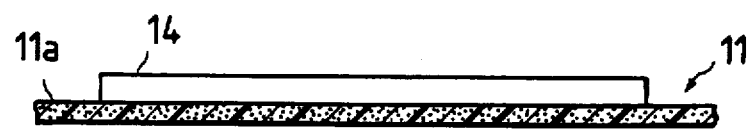
FIGS. 3(a) to 3(c) are diagrams illustrative of a dicing process using a conventional expand tape.
Figure 3B:
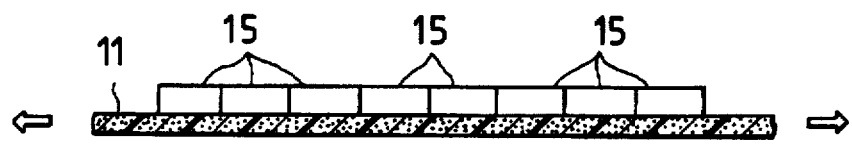
Figure 3C:
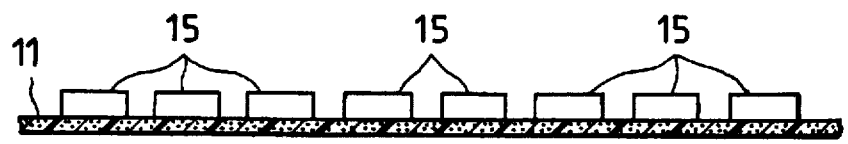

Each diced chip 5 is picked up by being adsorbed by a collet 7 as shown in FIG. 2(d). Since the piece 3a of the preform layer is adhered on the bottom of the chip 5, the chip 5 is ready to be die-bonded onto a lead frame, etc., immediately, thereby allowing the semiconductor manufacturing processes to be simplified.

As described in the foregoing, the expand tape of the present invention is formed of an expandable film and a preform layer provided thereon. As a result, not only the processes can be simplified and the hands involved in the processes can be decreased, but the burden on material handling can be reduced as well.

What is claimed is:

1. A method of producing a semiconductor device comprising the steps of:

applying a metal paste preform layer to an expand tape;

adhering a wafer to the preform layer on the expand tape;

cutting said wafer and said preform layer into chips, each chip having adhered to one surface a cut piece of said preform layer;

expanding said expand tape to separate said chips and said adhered cut pieces of said preform layer from adjacent chips and cut pieces;

picking up each of said chips together with the corresponding adhered cut piece of said preform layer; and die-bonding said each chip with said adhered cut piece of preform layer to a lead frame after said picking up step, wherein said adhering step is carried out through an adhesive layer of a thin adhesive sheet fixed to said preform layer.

* * * * *